United States Patent [19]

Iwase et al.

[11] Patent Number: 5,374,851

[45] Date of Patent: Dec. 20, 1994

[54] MEMORY APPARATUS

[75] Inventors: Seiichiro Iwase; Yoshihito Kondo, both of Kanagawa, Japan

[73] Assignee: Sony Corporation, Tokyo, Japan

[21] Appl. No.: 994,935

[22] Filed: Dec. 22, 1992

[30] Foreign Application Priority Data

Dec. 30, 1991 [JP] Japan ......................... 3-360689

[51] Int. Cl.⁵ .............................................. G11C 8/00
[52] U.S. Cl. ......................... 365/230.05; 365/230.09;
 365/189.12; 365/239; 365/240
[58] Field of Search ......... 365/230.05, 189.12,
 365/221, 239, 230.09, 240, 189.01

[56] References Cited

U.S. PATENT DOCUMENTS

| | | | |
|---|---|---|---|
| 5,036,489 | 7/1991 | Theobald | 365/221 |
| 5,065,368 | 11/1991 | Gupta et al. | 365/230.05 |
| 5,068,904 | 11/1991 | Yamazaki | 365/232 X |
| 5,185,724 | 2/1993 | Toda | 365/230.09 X |
| 5,260,905 | 11/1993 | Mori | 365/230.05 |

Primary Examiner—Eugene R. LaRoche
Assistant Examiner—Huan Hoang
Attorney, Agent, or Firm—Limbach & Limbach

[57] ABSTRACT

In a memory device, data stored in memory cells bridging memory cell columns for two lines can be read out in response to an address signal supplied only once. The memory cells (R00-R03), (R10-R13), (R10-R13), (R20-R23)m (R20-R23) and (R30-R33) for the two adjoining lines are connected to common word lines L0, L1, L2. Also, a series of bit lines are sequentially selected by a counter. The data stored in the memory cells bridging the memory cell columns for the two lines can be read out only once by supplying an address signal only one time.

4 Claims, 2 Drawing Sheets

MEMORY APPARATUS

BACKGROUND OF THE INVENTION

1. Field of the Invention

The present invention relates to a memory device, or apparatus capable of being applied to, for instance, an image data memory.

2. Description of the Prior Art

A dual port video RAM (random access memory) with such a structure as shown in FIG. 1 has been utilized as the conventional memory device (apparatus) 1 used in the image data process.

In this memory device 1, there are provided 16 (4×4) memory cells R00 to R33 at cross positions between, for instance, 4 word lines L0, L1, L2, and L3 and 4 bit lines L10, L11, L12, L13. Also, an upper 2-bit word addressing address signal 51 among a 4-bit address signal is supplied to 2-bit input terminals A0 and A1 of an address decoder DEC 1 used to connect outputs QA, QB, QC and QD to these word lines L0, L1, L2, L3, so that a designation is made of the word lines L0, L1, L2, L3 via the address decoder DEC 1, and memory cell rows (R00-R03), (R10-R13), (R20-R23), (R30-R33) for 4 lines connected to the respective word lines can be accessed.

The bit lines L10, L11, L12, L13 are connected respectively to the first memory cell (R00, R10, R20, R30), the second memory cell (R01, R11, R21, R31), the third memory cell (R02, R12, R22, R32), and the fourth memory cell (R03, R13, R23, R33) of the memory cell rows (R00-R03), (R10-R13), (R20-R23), (R30-R33), and furthermore via a buffer amplifier circuit AMPI to a 4-bit output register REG1. As a result, at the timing when a load signal S2 is supplied to a load terminal LD of the output register REG1, 4-bit memory data stored in the memory cells constituting the memory cell rows connected to the word lines designated by the address decoder DEC1 are stored into this output register REG1.

The memory data of the output register REG1 become outputs A, B, C, D of a selecting output circuit SEL1 including switching transistors TR1, TR2, TR3, TR4 which receive the bit outputs QA, QB, QC, QD of an output decoder DEC2 as open control signals, and then are sent out to an output line OUT 1 as serial output data S3.

To the 2-bit input terminals A0, A1 of the output decoder DEC2, outputs QB and QA of a bit address counter CNTRI are supplied. As a result, the counting operation of this bit address counter CNTR1 is performed as 1 period for a 4-bit address signal in response to a clock signal S4 supplied to a clock input terminal CLK based on a lower 2-bit bit-addressing address signal 55 among the 4-bit address signal furnished to the load input terminals B and A. Then, the 4 outputs A, B, C, D of the selecting output circuit SEL1 are sequentially sent out as output data S3 based on a head bit address designated by the bit-addressing address signal S5.

The load signal S2 for the output register REG1 is generated from a load control circuit CONT1 in synchronism with the output operation explained above.

In the arrangement of the conventional memory device shown in FIG. 1, image data for 1 line (namely, 4 bits image data) has been written by a separate write circuit (not shown) in the memory cells R00-R33 in such a manner that these memory cells occupy a single word line, or occupy two adjoining word lines.

If, for instance, image data for b 1 line is written into the memory cells in such a manner that the memory cell R00 is used as the head address for this 1-line image data, this 1 line image data is written into the memory cells (R00, R01, R02, R03). This 1-line image data does not bridge, or ride, memory cell rows for two word lines.

However, if the 1-line image data is written such that the memory cell R02 is used as the head address, this 1-line image data is written into the memory cells bridging the memory cell rows (R02, R03, R10, R11) of two word lines.

According to the arrangement of the conventional memory device shown in FIG. 1, when the 1-line image data is stored into the memory cells R00-R33 bridging the memory cell rows for two word lines, such a cumbersome memory operation must be carried out whereby after an n-th word line connected to the memory cell for the head address has been selected by the address decoder DEC1, an (n+1)th word line must subsequently be designated by the address decoder DEC1 at a predetermined timing. As a consequence, the address decoder DEC1 and the related peripheral circuitry may become complex.

SUMMARY OF THE INVENTION

The present invention has been made in an attempt to solve the above-described drawbacks of the conventional memory device, and therefore has an object to provide such a memory device with a simple arrangement, capable of completing a designation of a word line by only one access operation even when, for instance, 1-line image data has been stored into memory cells on two adjacent memory cell rows.

To achieve the above-described object, in accordance with a memory device of the present invention, wherein memory cells are connected at cross positions between a plurality of word lines and a plurality of bit lines, data stored in the said memory cells can be written, or read out by selecting among said plurality of word lines and said plurality of bit lines. The respective memory cells of a first memory cell row and a second memory cell row, which constitute memory cell rows for two adjacent lines, are connected to a common word line; data stored in the respective memory cells for the first and second memory cell rows are read and supplied into first and second output registers in response to address signals. Data corresponding to the bit lines can be selectively read out from the first and second output registers as output data.

In accordance with the memory device of the present invention, when the first and second memory cell rows connected to the common word line are designated by a word addressing address signal, the respective memory cells of these first and second memory cell columns are sequentially selected in response to a bit selecting signal produced by the bit addressing address signal. As a result, the data writing and reading operations can be achieved with this simple arrangement by designating the memory cells bridged over the memory cell rows for two lines, while the address signal is supplied only once.

BRIEF DESCRIPTION OF THE DRAWINGS

The above object and other useful features of the present invention will become more readily apparent in the following description and the accompanying drawings, in which.

DETAILED DESCRIPTION OF THE PREFERRED EMBODIMENTS

Figure 1:
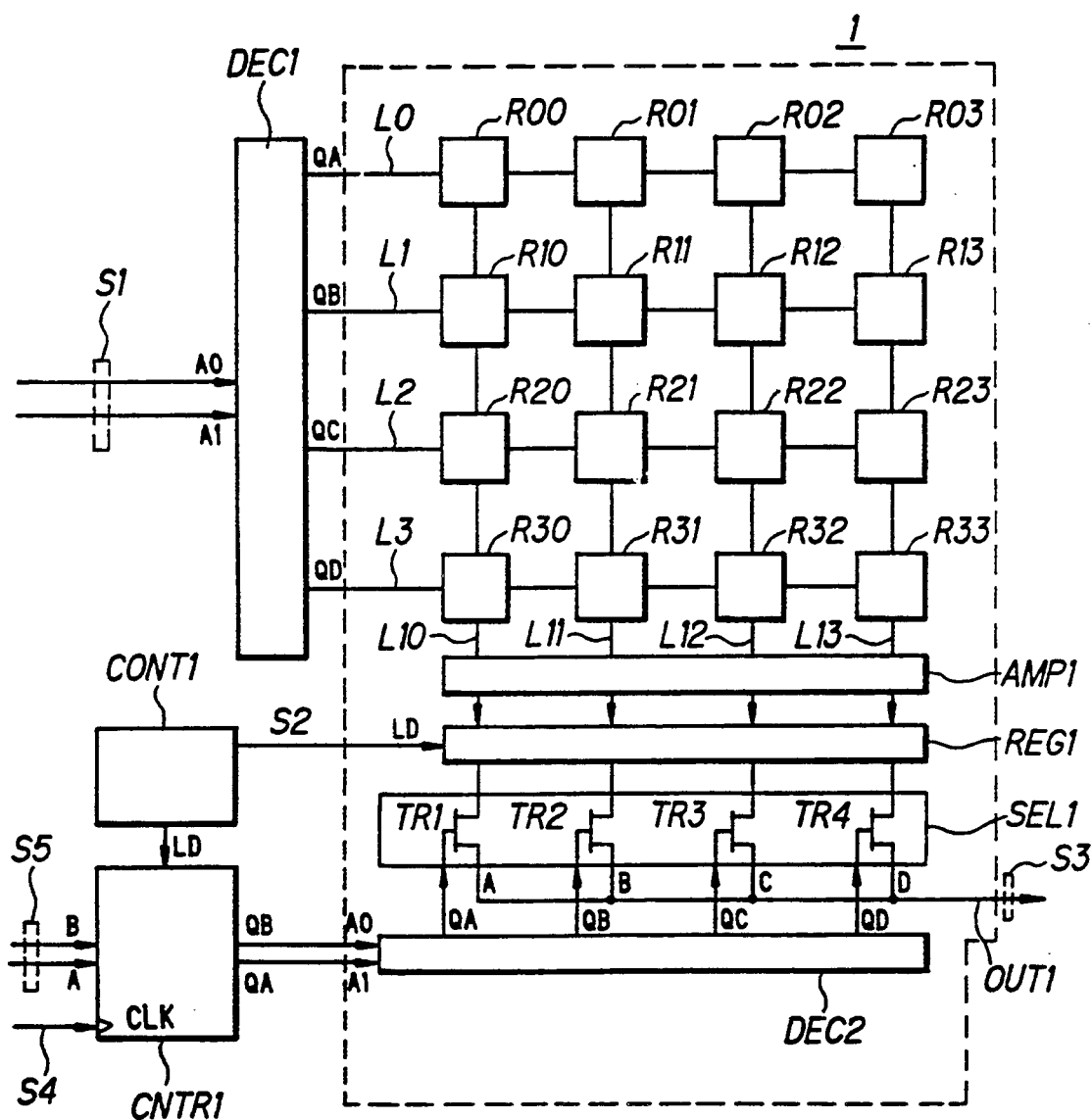
FIG. 1 is a schematic connection diagram of the conventional memory device.

Referring now to the drawings, a memory device (apparatus) according to a preferred embodiment of the present invention will be described with reference to FIG. 2.

Figure 2:
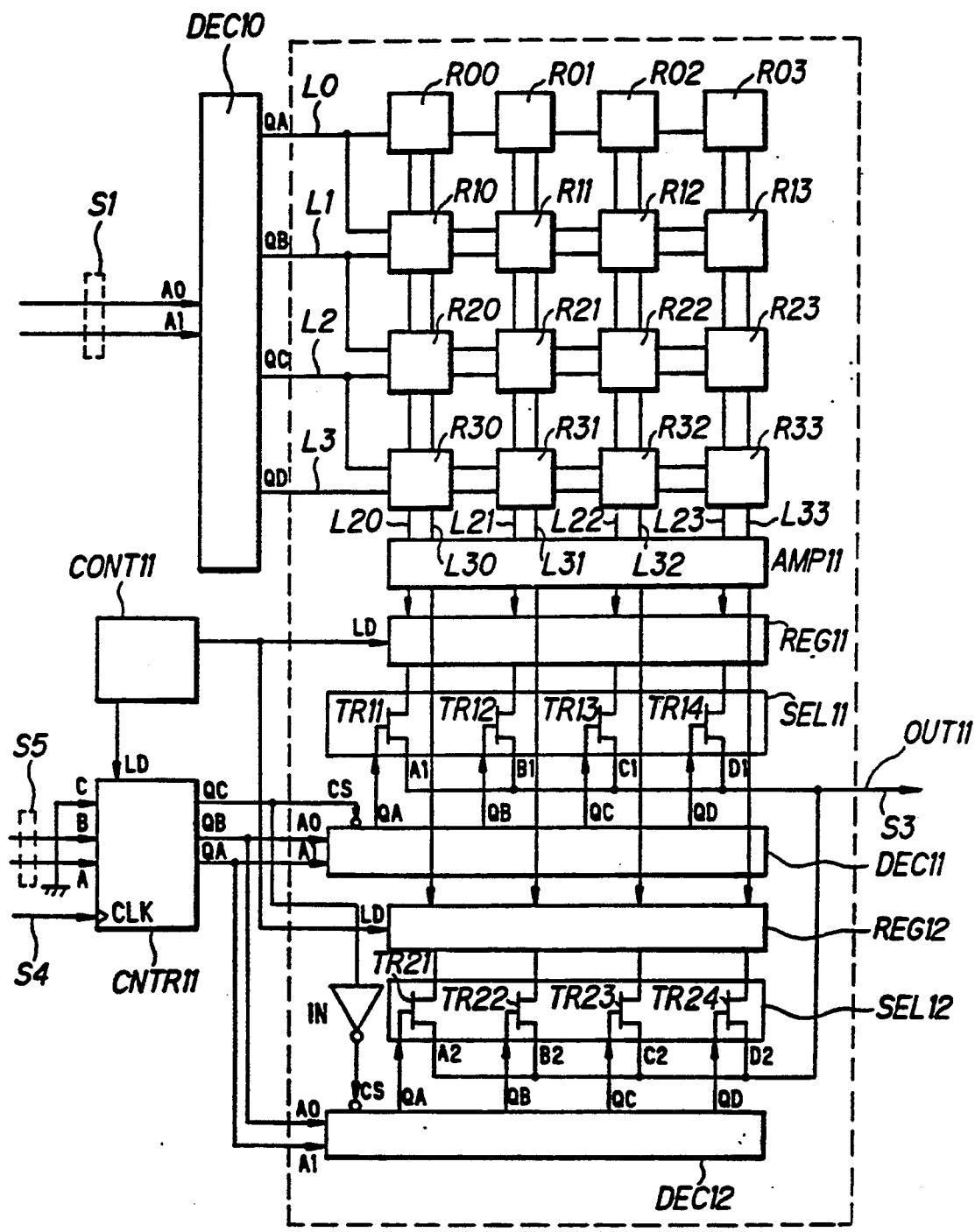
FIG. 2 is a schematic connection diagram of a memory device according to the present invention.

Similar to the conventional memory device shown in FIG. 1, memory cell rows (R00–R03), (R10–R13), (R20–R23) and (R30–R33) of this memory device indicated in FIG. 2 are connected to 0-th, first, second and third word lines L0, L1, L2 and L3. In addition thereto, the memory cells of the first, second and third rows (R10–R13), (R20–R23) and (R30–R33) are connected respectively to the 0-th, first and second word lines L0, L1, L2, forming a common connection with the memory cell rows (R00–R03), (R10–R13) and (R20–R23).

As to bit lines, the memory cells (R00–R30), (R01–R31), (R02–R32), (R03–R33) of the 0-th, first, second and third memory cell columns are connected to a first register REG11, via a buffer amplifier circuit AMP11, by means of bit lines L20, L21, L22 and L23, respectively. In addition, the memory cells (R00–R30), (R01–R31), (R02–R32), (R03–R33) of the 0-th, first, second and third memory cell columns are connected to a second register REG12, via said buffer amplifier circuit AMP11, by means of bit lines L30, L31, L32 and L33, respectively.

The 4-bit data stored in the first register REG11 become bit outputs A1, B1, C1 and D1 which run to a first selecting circuit SEL11 having switching transistors TR11, TR12, TR13 and TR14. Said switching transistors TR11, TR12, TR13, TR14 are turned ON/OFF in response to outputs QA, QB, QC and QD of a first output decoder DEC11. From said selecting circuit SEL11, said bit output A1, B1, C1, D1 are sent out to an output line OUT11 as output data S3.

In connection to this 4-bit memory data, the 4-bit data stored in the second register REG12 become bit outputs A2, B2, C2, D2. Said bit outputs A2, B2, C2, D2 run to a selecting circuit SEL12 having switching transistors T21, T22, T23 and T24 which are turned ON/OFF in response to outputs QA, QB, QC, QD of a second output decoder DEC12. From said selecting circuit SEL12, said bit outputs A2, B2, C2, D2 are sent to the output line OUT11 as output data S3.

An upper 2-bit word-addressing address signal S1 is supplied as 2-bit inputs A0, A1 of the word address decoder DEC10. Also, a lower 2-bit addressing address signal S5 is supplied as 2-bit inputs B, A of the bit address counter CNTR11. Thus, a designation can be made of the word line which is connected to all of the memory cells containing 1line image data, of a given head address, to be read by the word address decoder DEC10. Another designation can be made of the bit line connected to the memory cell corresponding to the head address to be read by the bit address counter CNTR11, and of the three subsequent bit lines.

In this preferred embodiment, the bit address counter CNTR11 has three bit inputs C, B, A (one input "C" is fixed to a logic level of "0"), and also three bit outputs QC, QB, QA, as shown in the following Table. The most significant bit (MSB) of the output QC is directly supplied to a control input terminal CS of the first output decoder DEC11. Said output QC is also supplied to another control input terminal CS of the second output decoder DEC 12 via an inverter "IN."

TABLE

| CNTR11 | | | DEC11 | | | | | DEC12 | | | | | |
|---|---|---|---|---|---|---|---|---|---|---|---|---|---|
| QC | QB | QA | CS | QA | QB | QC | QD | CS | QA | QB | QC | QD | OUT |
| 0 | 0 | 0 | 0 | 1 | 0 | 0 | 0 | 1 | 1 | 0 | 0 | 0 | A1 |
| 0 | 0 | 1 | 0 | 0 | 1 | 0 | 0 | 1 | 0 | 1 | 0 | 0 | B1 |
| 0 | 1 | 0 | 0 | 0 | 0 | 1 | 0 | 1 | 0 | 0 | 1 | 0 | C1 |
| 0 | 1 | 1 | 0 | 0 | 0 | 0 | 1 | 1 | 0 | 0 | 0 | 1 | D1 |
| 1 | 0 | 0 | 1 | 1 | 0 | 0 | 0 | 0 | 1 | 0 | 0 | 0 | A2 |
| 1 | 0 | 1 | 1 | 0 | 1 | 0 | 0 | 0 | 0 | 1 | 0 | 0 | B2 |
| 1 | 1 | 0 | 1 | 0 | 0 | 1 | 0 | 0 | 0 | 0 | 1 | 0 | C2 |
| 1 | 1 | 1 | 1 | 0 | 0 | 0 | 1 | 0 | 0 | 0 | 0 | 1 | D2 |

Accordingly, when the most significant bit of the output QC of the bit address counter circuit CNTR11 becomes a logic level of "0," the first output decoder DEC11 directly supplies outputs QA, QB, QC, QD to the selecting output circuit SEL11. When the counting operation of the bit address counter CNTR11 is commenced the address designation outputs of the bit address counter CNTR11 change from "00" to "01" to "10" to "11." As a result, the outputs QA, QB, QC, QD of the first output decoder DEC12 sequentially rise to a logic level of "1" in response to this signal change, so that bit outputs A1, B1, C1 and D1 are sequentially derived from the first selecting output circuit SEL11.

During this time, the second output decoder DEC12 is controlled in such a way that the transmissions of the outputs QA, QB, QC and QD are prohibited, since the control signal has been inverted. As a result, it is brought into such a condition that no data is outputted from the second selecting output circuit SEL12.

However, when the most significant bit (MSB) output QC of the bit address counter CNTR11 becomes "1" a control signal having a level of "0" is furnished to the control input terminal CS of the second output decoder DEC12, and also another control signal having a level of "1" is given to a control input terminal CS of the first output decoder DEC11. Thus, the outputs QA, QB, QC, QD of the second output decoder DEC12 sequentially rise to a signal level of "1" in response to the counting operation of the bit address counter CNTR11. As a result, the output data A2, B2, C2, D2 are sequentially sent out via the switching transistors TR21, TR22, TR23, TR24 of the second output control circuit SEL12 as the output data 53 of the output line OUT11. During this time, the control signal inputted to DEC11 prohibits transmission of the outputs QA, QB, QC and QD of DEC11, which in turn prohibits all output from the first selecting output circuit SEL11.

In case of the memory device according to the preferred embodiment, a load signal LD of the bit address counter CNTR11 is given from the load control circuit CONT11 to allow the first and second registers REG11 and REG12 to perform the data storing operation.

In the memory device 11 with the above circuit arrangement, when an address signal of "0010" is supplied to this memory device 11, since data "00" is given to the word address decoder DEC10 as the upper 2-bit word addressing address signal, a level 0-th word line L0 is increased up to a level of "1" by the word address decoder DEC10. Thus, the memory cells of the 0-th row (R00–R03) and the memory cells of the first row (R10–R13) are selected, so that the data is acquired respectively by the first register REG11 and the second register REG12.

In contrast thereto, since data "10" is given to the bit address counter CNTR11 as the lower 2-bit bit-addressing address signal S5, "0""1", and "0" are inputted respectively to the three bit input terminals C, B, A of the bit address counter CNTR11. These input data are supplied as the outputs QC, QB, QA to the first output decoder DEC11 and the second output decoder DEC12.

Because the most significant bit QC is "0", the output operation of the second output decoder DEC12 is prohibited, and thus the outputs QA, QB, QC, QD of the first output decoder DEC11 become "0", "0", "1" and "0". As a result, it is brought into such a condition that the output data C1 is outputted from the switching transistor TR13 of the selecting output circuit SEL11 into the output line OUT11.

Recall that the memory cell rows (R00–R03) and (R10–R13) for the two adjoining lines are designated by the content "00" of the upper 2-bit word addressing address signal S1. The bit cells (R00–R03) connected to the memory lines (L20–L23) are stored in the first register REG11, and the bit cells (R10–R13) connected to the bit lines (L30–L33) are stored in the second register REG12. At this time, the output operation of the output decoder DEC11 is permitted by the output QC of the bit address counter CNTR11.

Accordingly, the memory cell R02 is accessed as the memory cell of the head address designated by the address signal "0010" according to the content "10" of the lower 2-bit map address signal S5. This data is then sent out as the output data S3 via the first decoder DEC11 and the switching transistor TR13 of the first selecting output circuit SEL11.

Subsequently, when the counting operation of the bit address counter CLTR11 at a second cycle is performed and the outputs QC, QB, QA of this address counter become "011"the outputs QA, QB, QC, QD of the first output decoder DEC11 become "0001". Therefore, the data stored in the memory cell R03 becomes a bit output d1 which is outputted as the output data S3 via the first output register REG11 and the selecting output circuit SEL11.

Subsequent to this, when the counting operation of the bit address counter CNTR11 at a third cycle is performed and thus the outputs QC, QB, QA thereof become "100," the level of the control signal for the control terminals CS of the first and second output decoders DEC11 and DEC12 is changed from "0" to "1," so that the second output decoder DEC12 is brought into such a condition that the output can be produced from this decoder DEC12, and at the same time, the first output decoder DEC11 is so controlled that the output therefrom is prohibited.

At this time, since data "00" is supplied to the inputs A0, A1 of the second output decoder DEC12, the outputs QA, QB, QC, QD become "1000". As a consequence, the data stored in the memory cell R10 becomes a bit output A2 which is outputted as output data S3 via the second output register REG12 and the switching transistor TR21 of the selecting output circuit SEL12.

Subsequent to this, when the counting operation of the bit address counter CNTR11 at a fourth cycle is performed and thus the outputs QC, QB, QA thereof become "101," the outputs QA, QB, QC, QD of the second output decoder DEC12 become "0100". At this time, the data stored in the memory cell R11 becomes an output B2 which is outputted as output data S3 via the second output register REG12 and the second switching transistor TR22 of the second selecting output circuit SEL12.

As described above in detail, the data stored in the memory cells R02, R03, R10 and R11 are read out as 1-line image data in response to the address signal "0010."

In accordance with the present invention, the data stored in the memory cells, which are stored in the memory cell rows bridging two lines, can be read by supplying the address signal only once to the memory device 11.

To the contrary, when an address signal such as "0000" is supplied to the memory device 11, this designates 1-line image data stored only in a single row of memory cells (namely, memory data are not stored in memory cells bridging two rows) are designated, since the content of the upper 2-bit word-addressing address signal S1 correspond to "00," the memory cells of two rows (R00, R01, R02, R03) and (R10, R11, R12, R13) are designated by the word line L0 in a similar manner to that of the above case, and also data "000" are supplied to the inputs C, B, A of the bit address counter CNTR11 so that the outputs QC, QB, QA become "000." As a consequence, the outputs QA, QB, QC, QD of the first output decoder DEC11 become "1000." In this way, the bit line L20 is designated as the bit line of the head address.

Thereafter, in accordance with the counting operations of the counter CNTR 11 over 4 cycles, the data stored in the bit cells R00, R01, R02 and R03 sequentially become the bit outputs A1, B1, C1, D1. Said sequential bit outputs A1, B1, C1, D1 are sent out as the output data S3 via the first register REG11 and the switching transistors TR11, TR12, TR13, TR14 of the first selecting output circuit SEL11.

Note that in this case, the 1-line image data which does not bridge two rows of memory cells can still be read out by supplying the address signal only once.

In accordance with the above-described circuit arrangement of the memory device 11, even when an address signal designating memory cells bridging two rows is supplied, the image data for 1 line can be read out from these memory cells with a simple circuit arrangement and a simple operation which requires the address to be sent only once.

It should be noted that although the data written into the memory cells R00–R33, which correspond to 1 line of memory cell, has only been read out in the above-described preferred embodiment, the present invention is not thereby limited. For instance, the 1-line image data may be readily written on the memory cells bridging two memory cell rows with a simple circuit arrangement by supplying the address signal only one time. Similar to the read-operation described above, this address signal is used to designate the memory cells bridging two memory cell rows for two lines.

Also, the above-described circuit arrangements of the present invention may be applied the memory cells of SRAM (static RAM), or a DAM (dynamic RAM).

Furthermore, in the above-described embodiment, the present invention has been applied to the dual port memory device. However, the present invention is not limited to this memory device, but may be applied to a random access memory port memory device.

Also, the present invention has been applied to such a memory device 11 having 16 bits memory cells (namely, 4 bits×4 bits) in the above-described preferred embodiment. The present invention is not limited thereto, but may be similarly applied to a general-purpose memory device with NXM pieces memory cells ("N" and "M" being integers).

In the above-described preferred embodiment of the present invention, 1-bit serial data has been read as the output data S3. Alternatively, when multi-bit parallel data are required, a plurality of the circuit arrangements shown in FIG. 2 may be employed.

As previously described in detail, according to the present invention, even when the plural data is stored in the memory cells bridging two rows is read out and/or written as one set of data, this data processing operation can be easily realized with the simple circuit arrangement by supplying the address signal only one time.

What is claimed is:

1. A memory device wherein memory cells are connected at cross positions between a plurality of word lines and a plurality of bit lines, data stored in the respective bit cells can be written, or read out by selecting said plurality of word lines and said plurality of bit lines, characterized in that:

the respective memory cells of a first memory cell column and a second memory cell column, which constitute memory cell columns for two adjacent lines, are connected to a common word line; data stored in the respective memory cells for the first and second memory cell columns are read and supplied into first and second output decoders in response to address signals; and also data corresponding to the bit lines are selectively read out from first and second output registers as output data.

2. A memory apparatus in which memory cells are connected at intersecting positions between a plurality of word lines and a plurality of bit lines, data stored in the respective bit cells can be written, or read out by selecting said plurality of word lines and said plurality of bit lines, said apparatus comprising;

a plurality of word lines:

at least two pairs of bit lines commonly connected to at least two adjacent columns of said memory cells;

at least two output registers provided for each of said memory cells;

at least two output registers one being connected to one pair of bit lines and the other being connected to the other pair of bit lines;

at least two selecting circuit for selectively supplying outputs of said at least two output registers;

a bit address counter for generating an address designating output and a chip select signal; and at least two output decoders each for outputting a selection signal to said selecting circuits according to said address designating output of said bit address counter and said chip select signal which selects one of said two output decoders and is supplied to the other output decoders through an inverter.

3. A memory apparatus as claimed in claim 2, wherein said at least selecting circuits permits an output of one of said two output registers while intercepting an output of the output register to allow either of said output registers to output.

4. A memory apparatus as claimed in claim 3, said memory cells comprise a dual port RAM.

* * * * *